United States Patent [19]

Geiger

[11] Patent Number: 4,940,648
[45] Date of Patent: Jul. 10, 1990

[54] INCREASED SENSITIVITY PHOTOINITIATION COMPOSITIONS

[75] Inventor: Margaret W. Geiger, Neshanic Station, N.J.

[73] Assignee: Hoechst Celanese Corporation, Somerville, N.J.

[21] Appl. No.: 156,354

[22] Filed: Feb. 12, 1988

[51] Int. Cl.$^5$ .......................... G03C 1/70; G03C 1/78; G03C 1/94; B01J 37/34

[52] U.S. Cl. ..................... 430/272; 430/281; 430/275; 430/278; 430/916; 430/920; 522/24; 522/26; 502/5; 502/160

[58] Field of Search ............... 522/24, 26; 430/916, 430/920, 281, 275, 272, 278; 502/5, 160

[56] References Cited

U.S. PATENT DOCUMENTS

| | | | |
|---|---|---|---|
| 2,948,611 | 8/1960 | Barney | 430/281 |
| 3,047,422 | 7/1962 | Sites et al. | 430/281 |
| 3,729,313 | 4/1973 | Smith | 96/27 R |
| 3,765,898 | 10/1973 | Bauer et al. | 430/920 X |
| 3,954,475 | 5/1976 | Bonham et al. | 96/67 |
| 4,046,577 | 9/1977 | Muzycko et al. | 96/115 R |
| 4,239,850 | 12/1980 | Kita et al. | |
| 4,258,123 | 3/1981 | Nagashima et al. | 430/281 |
| 4,416,975 | 11/1983 | Green et al. | 430/270 X |
| 4,481,276 | 11/1984 | Ishikawa et al. | 430/281 |
| 4,498,963 | 2/1985 | Neckers | 430/916 X |
| 4,505,793 | 3/1985 | Tamoto et al. | 204/159.16 |
| 4,587,200 | 5/1986 | Tamoto et al. | 430/920 X |
| 4,684,670 | 8/1987 | Eckberg et al. | 522/24 X |
| 4,746,685 | 5/1988 | Masuhara et al. | 522/24 X |
| 4,772,538 | 9/1988 | Walls et al. | 430/920 X |
| 4,845,011 | 9/1989 | Wilczak | 430/920 X |

FOREIGN PATENT DOCUMENTS

| | | | |
|---|---|---|---|
| 0126541 | 11/1984 | European Pat. Off. | 430/916 |
| 0196561 | 10/1986 | European Pat. Off. | |
| 0211615 | 2/1987 | European Pat. Off. | |
| 60-060104 | 4/1985 | Japan | |

*Primary Examiner*—Paul R. Michl
*Assistant Examiner*—Cynthia Hamilton
*Attorney, Agent, or Firm*—Richard S. Roberts

[57] ABSTRACT

A photo polymerization initiator composition is disclosed. The composition is comprised of an organic peroxide or perester in admixture with 9-phenyl acridine, or phenazine initiator compound. The initiator composition is useful in preparing photopolymerizable compositions having increased effective photospeed.

24 Claims, No Drawings

INCREASED SENSITIVITY PHOTOINITIATION COMPOSITIONS

BACKGROUND OF THE INVENTION

The present invention relates to image reproduction systems which employ photopolymerizable image forming layers. More particularly, the invention relates to a photopolymerizable composition having increased effective photosensitivity which finds use in producing photosensitive elements such as lithographic printing plates of the projection speed variety.

The prior art teaches a plethora of photopolymerizable compositions. These generally comprise an ethylenically unsaturated monomer or oligomer preferably having two or more double bonds, a photoinitiator capable of causing the free radical polymerization of the unsaturated component upon exposure to actinic radiation, and usually binder resins, colorants and components to prevent premature polymerization. Further, these compositions are widely used in photopolymer type photoresists and printing plates.

Useful photo polymerization initiators include various substances which have been found to be practical. For example, there are benzoin compounds such as benzoin, benzoin methyl ether, or benzoin ethyl ether, etc., carbonyl compounds such as benzil, benzophenone, acetophenone or Michler's ketone, etc., azo compounds such as azobisisobutyronitrile, as well as initiators of the acridine, quinoxaline or phenazine classes. While such photoinitiators are certainly useful within their concepts, it is often desired to produce photographic elements which have a greater effective photospeed than these initiators can afford. Higher effective photospeed is desired for photosensitive elements which are exposed by low intensity lasers or the so-called projection speed plates. In non-projection speed plates, exposure is conducted by placing an exposure mask in direct contact with the photographic emulsion in a vacuum frame. Exposure is then conducted with a high intensity ultraviolet light source. In a projection exposure system, the exposure mask is placed in the path of an exposure unit between the light source and a camera's objective lens. The image projects through the lens onto a printing plate positioned on a platform. Exposure energy and duration is greatly reduced, therefore, photosensitivity should be commensurately enhanced. The foregoing classes of photoinitiators alone are not satisfactorily sensitive for such use.

SUMMARY OF THE INVENTION

The invention provides a photopolymerization initiator composition which comprises an acridine, quinoxaline or phenazine compound which is capable of generating a free radical upon the application of actinic radiation, and at least one organic peroxide or perester compound.

The invention also provides a photopolymerizable composition which comprises a photopolymerizable compound containing at least two ethylinically unsaturated double bonds and a photopolymerization initiator composition which initiator composition comprises an acridine, qunioxaline or phenazine compound which is capable of generating a free radical upon the application of actinic radiation and at least one peroxide or perester compound.

The invention also provides a photographic element which comprises a substrate and a photopolymerizable composition coated on said substrate, which photopolymerizable compound containing at least two ethylinically unsaturated double bonds and a photopolymerization initiator composition which initiator composition comprises an acridine, quinoxaline of phenazine compound which is capable of generating a free radical upon the application of actinic radiation and at least one peroxide or perester compound.

DETAILED DESCRIPTION OF THE PREFERRED EMBODIMENT

In general, the photoinitiator composition of this invention comprises at lease one acridine, quinoxaline or phenazine photoinitiator compound and at lease one organic peroxide or perester compound. The preferred photoinitiators have one of the formulas

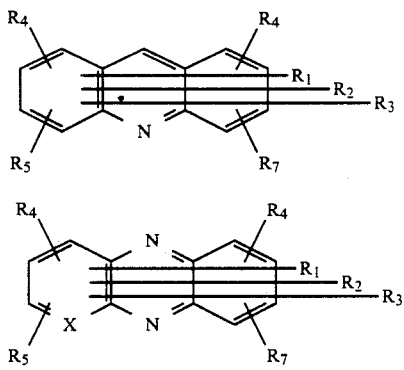

in which $R_1$, $R_2$ and $R_3$ are selected from the group consisting of hydrogen, halogen, alkyl, alkoxy, aryl, aryloxy, amino, acylamino, and aralkenyl groups, $R_4$, $R_5$, $R_6$ and $R_7$ are H or annelated benzene rings, with no more than two annelated benzene rings being present per molecule, however, and X is selected from the group consisting of

These compounds are more fully described in U.S. Pat. No. 3,751,259 which is incorporated herein by reference. The most preferred species is 9-phenyl acridine.

The organic peroxides used in the present invention include nearly all organic compounds having one or more oxygen-oxygen bonds in the molecule. Examples of them include methyl ethyl ketone peroxide, cyclohexanone peroxide, 3,3,5-trimethylcyclohexanone peroxide, methycyclohexanne peroxide, acetylacetone peroxide, 1,1-bis(tertiary butyl peroxy)-3,3,5-trimethylcyclohexane, 1,1-bis(tertiary butyl peroxy)cyclohexane, n-butyl-4,4-bis(tertiary butyl peroxy)valerate, 2,2-bis(-tertiary butyl peroxy)butane, tertiary butyl hydroperoxide, cumene hydroperoxide, diisopropylbenzene hydroperoxide, p-menthane hydroperoxide, 2,5-dimethylhexane-2,5-dihydroperoxide, 1,1,3,3-tetramethylbutyl hydroperoxide, di-tertiary butyl peroxide, tertiary butylcumyl peroxide, dicumyl peroxide, a,a'-bis(tertiary butyl peroxyisopropyl)benzene, 2,5-dimethyl-2,5-di(tertiary butyl peroxy)hexane, 2,5-dimethyl-2,5-di(tertiary butyl peroxy)hexyne-3, acetyl peroxide, isobutyryl peroxide, octanoyl peroxide, decanoyl peroxide, lauroyl peroxide, 3,5,5-trimethylhexanoyl peroxide, peroxysuccinic acid, benzoyl peroxide, 2,4-dichlorobenzoyl peroxide, m-toluoyl peroxide, diisopropyl peroxydicarbonate, di-2-ethylhexyl peroxydicarbonate, di-normal propyl peroxydicarbonate, di-2-ethoxyethyl peroxydicarbonate, dimethoxy-isopropyl peroxycarbonate, di(3-methyl-3-methoxybutyl)peroxydicarbonate, tertiary butyl peroxyacetate, tertiary butyl peroxyisobutyrate, tertiary butyl peroxypivalate, tertiary butyl peroxyneodecanoate, tertiary butyl peroxyoctanoate, tertiary butyl peroxy-3,5,5-trimethylhexanoate, tertiary butyl peroxylaurate, tertiary butyl peroxybenzoate, di-tertiary butyl diperoxyisophthalate, 2,5-dimethyl-2,5-di(-benzoylperoxy)hexane, tertiary butyl peroxymaleic acid, and tertiary butyl peroxyisopropylcarbonate, etc.

Among the above organic peroxides, benzoyl group-containing organic peroxides are preferred, for example, tertiary butyl peroxybenzoate, di-tertiary butyl diperoxyisophthalate, 2,5,-dimethyl-2,5-di(benzoylperoxy)hexane, benzoyl peroxide, 2,4-dichlorobenzoyl peroxide and m-toluoyl peroxide. Among the benzoyl group-containing organic peroxides, peroxy ester type organic peroxides are particularly preferred, for example, tertiary butyl peroxybenzoate, di-tertiary butyl diperoxyisophthalate and 2,5-dimethyl-2,5-di(bensoylperoxy)hexane. Peresters non-exclusively include t-butyl perbenzoate and t-butyl-1-pernaphthoate.

The ratio of acridine, quinoxaline of phenazine compound to peroxide or perester compound may range from 1:99 to 99:1 or more preferably from about 1:25 to 65:1 and most preferably from about 2:1 to 1:2.

The photopolymerizable composition of this invention generally comprises a photopolymerizable material having at least two double bonds and the foregoing photoinitiator composition. The photopolymerizable composition additionally has a binder resin in the preferred embodiment.

The photopolymerizable material comprises an addition polymerizable, non-gaseous (boiling temperature above 100° C. at normal atmospheric pressure), ethylenically-unsaturated compounds containing at least two terminal ethylenic groups, and being capable of forming a high molecular weight polymer by free-radical initiated, chain propageting addition polymerization. Suitable polymerizable materials non-exclusively include such acrylic or methacrylic acid esters as polybutane diol diacrylate, tetraethylene glycol dimethacrylate, ethylene glycol dimethacrylate, trimethylol propane timethyacrylate, trimethylol propane triacylate, polyethylene glycol (200) diacrylate, diethylene glycol dimethacrylate, pentaerythritoltetraacrylate, dicyclopentenyl acrylate, dicyclopentenyl methacrylate, 1,4 butane diol diacrylate, 1,6, hexanediol dimethacrylate, dipentaerythritol monohydroxypentaacrylate, ethoxylate bisphenol a dimethacrylate and triproplyene glycol diacrylate. Oligomers such as Uvithane 788 (Morton Thiokol) and Macromer 13KRC (Sartomer) are also suitable.

Binders found suitable for this use are styrene/maleic anhydride polymers that can vary in monomer content at a ratio of from about 70/30 to about 95/5; polymethyl methacrylate/methacrylic acid copolymers having a ratio of monomers ranging from about 70/30 to 95/5; polymethyl methacrylate/ethyl acrylate/methacrylic acid copolymer having a ratio of monomers ranging from about 50/30/20 to about 90/5/5; polymethyl methacrylate/butyl acrylate/methacrylic acid copolymer having a ratio of monomers ranging from about 50/30/20 to about 90/5/5. Binders with no acid value but with the solubility characteristics to develop properly in the alkaline aqueous developers useful for the invention. Examples of this type of binder system non-exclusively include polyvinyl pyrrolidone polymers K-60 and K-90 (G.A.F.) cellulosic resins such as hydroxypropyl cellulose, methyl cellulose and ethyl hydroxy ethyl cellulose polymers. Additional binders non-exclusively include polyvinyl acetals such as polyvinyl formal and polyvinyl butyral available as Formvar and Butvar from Monsanto, and polyvinyl alcohols.

One preferred binding resin has the general formula

wherein a plurality of each of components A, B and C occur in ordered or random sequence in the resin and wherein A is present in said resin at about 5% to about 20% by weight and comprises groups of the formula

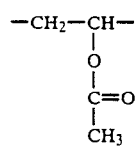

B is present in said resin at about 4% to about 30% by weight and comprises groups of the formula

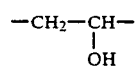

and C is present in said resin at about 50% to about 91% by weight and comprises acetal groups consisting of groups of the formulae

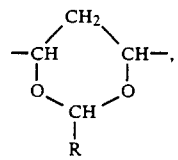

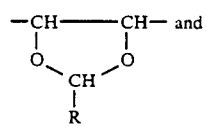

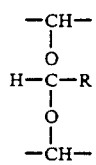

where R is lower alkyl or hydrogen, and wherein said group I is present in component C from about 75% to about 85%, group II is present in component C from about 3% to about 5%; and group III is present in component C from about 10% to about 22%; wherein said groups I, II and III are based on the number of acetal groups in component C. This composition is more fully described in U.S. Pat. No. 4,670,507 which is incorporated herein by reference.

Pigments or dyes may typically be included in the photopolymerizable composition to provide color to the image areas.

Preferred colorants for this invention are pigments and dyes. They are dispersed in a small amount of a suitable vehicle such as polymethyl methacrylate/methacrylic acid (85/15) and methyl ethyl ketone solvent.

Additional non-exclusive examples of colorants usable in the present invention are as follows: Benzidine Yellow G (C.I. 21090), Benzidine Yellow Gr (C.I. 21100), Permanent Yellow DHG (product of Hoechst AG), Brilliant Carmine 6B (C.I. 15850), Rhodamine 6G Lake (C.I. 45160), Rhodamine B Lake (C.I. 45170), Phthalocyanine Blue non-crystal (C.I. 74160), phthalocyanine Green (C.I. 74260), Carbon Black, Fat Yellow 5G, Fat Yellow 3G, Fat Red G, Fat Red HRR, Fat Red 5B, Fat Black HB, Zapon Fast Black RE, Zapon Black G, Zapon Fast Blue HFL, Zapon Fast Red BB, Zapon Fast Red GE, Zapon Fast Yellow G, quinacridone Red (C.I. 46500).

In the practice of the present invention the binder component is preferably present in the composition in an amount sufficient to bind the composition components in a uniform mixture and a uniform film when it is coated on a substrate. It is preferably present in an amount ranging from about 36% to about 54% based on the weight of the solids in the layer. A more preferred range is from about 38% to about 52% and most preferably from about 40% to about 50%.

In the practice of the present invention the photoinitiator composition is preferably present in the photopolymerizable composition in an amount sufficient to initiate the free radical polymerization of the unsaturated component upon exposure to imaging energy. It is preferably present in an amount ranging from about 0.2% to about 7% based on the weight of the solids in the layer. A more preferred range is from about 1% to about 5.5% and most preferably from about 1.5% to about 4%.

In the practice of the present invention the colorant component is preferably present in an amount sufficient to uniformly color the photopolymerizable composition. It is preferably present in an amount ranging from about 0% to about 7% based on the weight of the solids in the layer. A more preferred range is from about 0.1% to about 6% and most preferably from about 0.2% to about 5%.

In the practice of the present invention the unsaturated component is preferably present in the composition in an amount sufficient to cause an imagewise latent differential in the polymerizable composition when it is coated on a substrate and imagewise exposed to imaging energy. It is preferably present in an amount ranging from about 20% to about 60% based on the weight of the solids in the layer. A more preferred range is from about 22% to about 58% and most preferably from about 25% to about 55%.

Other components which may be included in the radiation-polymerizable composition of this invention include acid stabilizers, exposure indicators, plasticizers and photoactivators.

Suitable acid stabilizers useful within the context of this invention include phosphoric, citric, benzoic, m-nitro benzoic, p(p-anilino phenylazo) benzene sulfonic acid, 4,4'-dinitro-2,2'-stilbene disulfonic, itaconic, tartaric and p-toluene sulfonic acid and mixtures thereof. Preferably, the acid stabilizer is phosphoric acid. When used, the acid stabilizer is preferably present in the radiation-polymerizable composition in the amount of from about 0.3% to about 2.0%, and most preferably from about 7.5% to about 1.5%, although the skilled artisan may use more or less as desired. Exposure indicators (or photoimagers) which may be useful in conjunction with the present invention include 4-phenylazodiphenylamine, eosin, azobenzene, Calcozine Fuchine dyes and Crystal Violet and Methylene Blue dyes. Preferably, the exposure indicator is 4-phenylazodiphenylamine. The exposure indicator, when one is used, is preferably present in the composition in an amount of from about 0.001% to about 0.0035% by weight. A more preferred range is from about 0.002% to about 0.030% and, most preferably, the exposure indicator is present in an amount of from about 0.005% to about 0.20%, although the skilled artisan may use more or less as desired.

The photoactivator which may be included in the composition of this invention should be an amine-containing photoactivator which combines synergistically with the free-radical photoinitiator in order to extend the effective half-life of the photoinitiator, which is normmally in the approximate range of about $10^{-9}$ to $10^{-15}$ seconds. Suitable photoactivators include 2-(N-butoxy) ethyl-4-dimethylamino benzoate, 2-(dimethylamino) amino benzoate and acrylated amines. Preferably the photoactivator is ethyl-4-dimethylamino benzoate. The photoactivator is preferably present in the composition of this invention in an amount of from about 1.0% to about 4.0% by weight, although the skilled artisan may use more or less as desired.

A plasticizer may also be included in the composition of this invention to prevent coating brittleness and to keep the composition pliable if desired. Suitable plasticizers include dibutylphthalate, triarylphosphate and substituted analogs thereof and, preferably dioctylphthalate. The plasticizer is preferably present in the composition of this invention in an amount of from about 0.5% to about 1.25% be weight, although the skilled artisan may use more or less as desired.

In order to form a coating composition for the production of photographic elements, the composition of this invention may be dissolved in admixture in a solvent or mixture of solvents to facilitate application of the composition to the substrate. Suitable solvents for this purpose include water, tetrahydrofuran, butyrolactone, glycol ethers such as propylene glycol monomethyl ether and methyl Cellosolve, alcohols such as ethanol and n-propanol, and ketones such as methyl ethyl ketone, or mixtures thereof. Preferably, the solvent comprises a mixture of tetrahydrofuran, propylene glycol, monomethyl ether and butyrolactone. In general, the solvent system is evaporated from the coating composition once it is applied to an appropriate substrate, however, some insignificant amount of solvent may remain as residue.

Substrates useful for coating with the composition of this invention to form a photographic element such as a color proofing film, silk screen stencil, photoresist or lithographic printing plate include sheets of transparent films such as polyester, aluminum and its alloys and other metals, fabrics, silicon and similar materials useful for semiconductors such as gallium arsenide which are well known in the art. Preferably, the substrate comprises aluminum. The substrate may first be pretreated by standard graining and/or etching and/or anodizing techniques as are well known in the art, and also may or may not have been treated with a composition such as polyvinyl phosphonic acid, sodium silicate or the like suitable for use as a hydrophilizing agent.

In the production of photographic elements such as lithographic printing plates, an aluminum substrate is first preferably grained by art recognized methods such as by means of a wire brush, a slurry of particulates or by chemical or electrochemical means, for example in an electrolyte solution comprising hydrochloric acid. The grained plate is preferably then anodized for example in sulfuric or phosphoric acid in a manner well known in the art. The grained and optionally anodized surface is preferably then rendered hydrophilic by treatment with polyvinyl phosphonic acid by means which are also known to the skilled artisan. The thusly prepared plate is then coated with the base composition of the present invention, preferably at a coating weight of from about 0.6 g/m$^2$ to about 4 g/m$^2$, more preferably from about 0.8 g/m$^2$ to about 3.0 g/m$^2$ and most preferably from about 1.0 g/m$^2$ to about 2.0 g/m$^2$, although these coating weights are not critical to the practice of this invention, and dried.

The light sensitive layer is then exposed to actinic radiation such as ultraviolet or x-ray or exposed to a particle beam such as electron or ion beam. In the preferred embodiment, the photosensitive layer is image-wise exposed by means well known in the art. Such exposure may be conducted by exposure to a UV light source through a photomask under vacuum frame conditions. Exposure may be performed with actinic light through a conventional negative flat. Exposures are preferred with emulsion-to-emulsion contact. Mercury vapor discharge lamps are preferred to metal halide lamps. Filters may be used to reduce light scattering in the material.

Preferably the thusly prepared photographic element is exposed to actinic radiation through a negative test flat so as to yield a solid 6 on a 21 step Stouffer exposure wedge after development. The exposed plate is then developed with a suitable aqueous developer composition such as a developer which comprises an aqueous solution containing one or more of the following groups:

(a) a sodium, potassium or lithium salt of octyl, decyl or dodecyl monosulfate;

(b) a sodium, lithium, potassium or ammonium meta-silicate salt; and (c) a lithium, potassium, sodium or ammonium borate salt; and (d) an aliphatic dicarboxylic acid, or sodium, potassium or ammonium salt thereof having from 2 to 6 carbon atoms; and (e) mono, di-, or tri-sodium or -potassium phosphate.

Other suitable developers include water, benzoic acid or sodium, lithium and potassium benzoates and the hydroxy substituted analogs thereof as well as those developers described in U.S. Pat. No. 4,436,807. The developer may also contain organic solvents which are well known in the art, although these are less preferred.

The following examples are illustrative of the invention but it is understood that the invention is not limited thereto.

EXAMPLE 1

The following stock solution is prepared (units of weight percent):

| | |
|---|---|
| 34.3% polymethyl methacrylate/methacrylic acid | 14.819 |
| ethoxylated trimethylol propane triacrylate | 5.365 |
| BASF Basacryl blue green X5G | .038 |
| propylene glycol monomethyl ether | 53.246 |
| n-butyl acetate | 26.623 |

The amounts of initiator (grams) indicated in Table I are added to 35 g of stock solution to prepare coating solutions.

TABLE 1

| Initiator | A | B | B-1 | B-2 | B-3 | B-4 | C | C-1 | D | D-1 |
|---|---|---|---|---|---|---|---|---|---|---|
| 9-phenyl-acridine | | .029 | .029 | .029 | .029 | .029 | | | | |
| 5,7-dimethyl-1,2-benzacridine | | | | | | | .06 | .06 | | |
| dibenzo-(a,c)-phenazine | | | | | | | | | .02 | .02 |
| benzoyl peroxide | .014 | | .014 | | | | | .014 | | .014 |
| t-butyl perbenzoate | | | | .013 | | | | | | |
| Lupersol KDB* | | | | | .04 | | | | | |
| t-butyl-1-peroxynaphthoate | | | | | | .014 | | | | |
| Exposure Time: (seconds) | 100 | 5 | 5 | 5 | 5 | 5 | 5 | 5 | 5 | 5 |
| Solid Step | None | 6 | 9 | 9 | 11 | 9 | 2 | 6 | 1 | 4 |

*Pennwalt di-t-bityl diperoxyphthalate

The solutions are spin coated on electrochemically grained, anodized aluminum. The coating is overcoated with a 3% polyvinyl alcohol solution with a #24 wire wound rod and dried in a 66° C. oven for 5 minutes. The coated plates are exposed in a vacuum frame through a Stouffer senstivity guide, then developed with ENCO NAPS/PAPS developer (commercially available from Hoechst Celanese Corporation). The step results are given in Table I.

EXAMPLE 2

The following stock solution is prepared.

| | |
|---|---|
| 9-phenylacridine | .210 |
| Lupersol KDB | .071 |
| 34.3% polymethyl methacrylate/methacrylic acid (85:15 in MEK) | 8.943 |
| polymethyl methacrylate/methacrylic acid | .340 |
| propylene glycol monomethyl ether | 85.529 |
| pigment dispersion | 4.907 |

The pigment dispersion consists of:

| | |
|---|---|
| phthalocyanine blue | 6.5 |
| resin[1] | 5.5 |
| gamma-butyrolactone | 43.5 |
| propylene glycol monomethyl ether | 43.5 |

[1] Resin - partially hydrolyzed polyvinylacetate, partially modified with propanal, as described in U.S. Pat. No. 4,652,604.

Coating solutions are prepared by adding 0.83 of the monomers in Table 2 to 30 g of stock solution.

TABLE 2

| Monomer | Solid Step |
|---|---|
| propoxylated trimethylol propane triacrylate | 7 |
| Photomer 4158 (Henkel) | 7 |
| Photomer 5018 (Henkel) | 4 |
| penterythritol tetracrylate | 6 |
| dipentaerythritol pentacrylate | 1 |
| Sartomer C-9008 (ARCO) | 9 |
| Sartomer C-9041 (ARCO) | 2 |
| pentaerythritol triacrylate | 7 |

The solutions are spin coated on electrochemically grained, anodized aluminum. The coating is overcoated with a 3% polyvinyl alcohol sulution with a #24 wire wound rod and dried in a 66° C. oven for 5 minutes. The coated plates are exposed in a vacuum frame through a Stouffer sensitivity guide for 5 seconds, then developed with ENCO NAPS/PAPS developer (commerically available from Hoechst Celanese Corporation). The step results are given in Table 2.

EXAMPLE 3

Using a #24 wire wound rod, electrochemically grained, anodized aluminum is coated with a solution containing:

| | |
|---|---|
| 34.3% polymethyl methacrylate/methacrylic acid | 23.141 g |
| trimethylol propane triacrylate | 8.336 |
| 9-phenylacridine | .141 |
| benzoyl peroxide | .060 |
| pigment dispersion | 2.322 |
| n-butylacetate | 22.050 |
| propylene glycol monomethyl ether | 42.950 |

The pigment disperson consists of:

| | |
|---|---|
| red pigment | 4.5 g |
| polymethyl methacrylate/methacrylic acid | 13.5 |
| methyl ethyl ketone | 82.0 |

The coated plate is overcoated with 3% (poly(vinyl alcohol) solution with a #24 wire wound rod and dried in a 66° C. oven for 5 minutes.

The plate is exposed in a vacuum frame and developed with ENCO ANPS/PAPS developer (commercially available from Hoechst Celanese Corporation). A two-second exposure results in a solid 9 on the Stouffer scale. A plate coated with the same solution with no benzoyl peroxide gave a solid 4 upon a two-second exposure.

EXAMPLE 4

Electrochemically grained, anodized aluminum is menisus coated at a coating weight of 1.5 g/m² with the following solution:

| | |
|---|---|
| 9-phenylacridine | .185 |
| Lupersol KDB | .065 |
| ethoxylated trimethylolpropane triacrylate | 3.571 |
| 34.3% polymethyl methacrylate/methacrylic acid (85:15 in MEK) | 8.620 |
| polymethyl methacrylate/methacrylic acid (95:5) | .320 |
| propylene glycol monomethyl ether | 82.502 |
| pigment dispersion | 4.740 |

The pigment dispersion consists of:

| | |
|---|---|
| phthalocyanine blue | 6.5 |
| resin[1] | 5.5 |
| gamma-butyrolactone | 43.5 |
| propylene glycol monomethyl ether | 43.5 |

[1] Resin partially hydrolyzed polyvinylacetate, partially modified with propanol, as described in U.S. Pat. No. 4,652,604.

The coated material is overcoated with 3% polyvinylalcohol at a coating weight of 2.0 g/m².

The coated plate is exposed in a vacuum frame through Dylux clearing film (from DuPont), which cuts off wavelengths of light less than 400 nm. The plate is developed with ENCO aqueous developer. An eight second exposure gives a solid 6 on the Stouffer scale. This corresponds to an energy density of about 30 mj/cm².

EXAMPLE 5

A stainless steel screen stencil is scoop coated with a solution prepared in the following manner:

| | |
|---|---|
| 9-phenylacridine | 0.18 |
| di-t-butyl diperoxyphthalate (40% solution) | 0.27 |
| pentaerythritol triacrylate | 7.67 |
| PVP K-90 | 15.34 |
| ethanol | 38.27 |
| water | 38.27 |

The film produced from this solution is exposed for 200 units (1.2 j/cm²) and developed with water. A satisfactory image is obtained.

What is claimed is:

1. A photopolymerization initiator composition which comprises 9-phenyl acridine or a phenazine compound and at least one organic perioxide or perester compound.

2. The initiator composition of claim 1 which comprises one or more compounds selected from the group consisting of benzoyl peroxide, di-t-butyl diperoxyphthalate, t-butyl perbenzoate and t-butyl-1-pernaphthoate.

3. The initiator composition of claim 1 wherein the ratio of 9-phenyl acridine, or phenazine compound to peroxide or perester compound ranges from about 99:1 to about 1:99.

4. A dried photopolymerizable monomer or oligomer composition which comprises a photopolymerizable compound containing at least two ethylenically unsaturated double bonds and a photopolymerization initiator composition which initiator composition comprises a 9-phenyl acridine, or a phenazine compound which is capable of generating a free radical upon the application of actinic radiation and at least one peroxide or perester compound.

5. The photopolymerizable composition of claim 4 wherein the photopolymerizable compound is an acrylic or methacrylic acid ester.

6. The photopolymerizable composition of claim 4 further comprising a binder in sufficient amount to bind the composition components in a uniform mixture.

7. The photopolymerizable composition of claim 4 comprising a binder selected from the group consisting of polyvinyl acetals, polyvinyl pyrrolidone, cellulosic resins, styrene maleic anhydride copolymers, styrene/maleic anhydride polymers having a monomer ratio of from about 70/30 to about 95/5; polymethyl methacrylate/methacrylic acid copolymers having a monomer ratio of from about 70/30 to about 95/5; polymethyl methacrylate/ethyl acrylate/methacrylic acid copolymer having a monomer ratio of from about 50/30/20 to 90/5/5; and polymethyl methacrylate-butyl acrylate/methacrylic acid copolymer having a monomer ratio of from about 50/30/20 to about 90/5/5.

8. The photopolymerizable composition of claim 6 wherein the binding resin has the general formula

-A-B-C- wherein a plurality of each of components A, B and C occur in ordered or random sequence in the resin and wherein A is present in said resin in about 5% to about 20% by weight and comprises groups of the formula

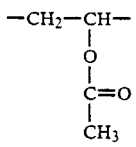

B is present to said resin at about 4% to about 30% by weight and comprises groups of the formula

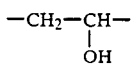

and C is present in said resin at about 50% to about 91% by weight and comprises acetal groups consisting of groups of the formulae

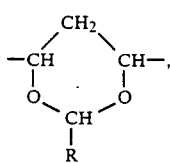 (I)

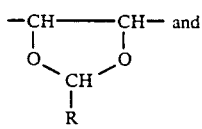 (II)

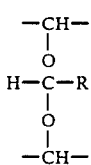 (III)

where R is lower alky or hydrogen, and wherein said group I is present in component C from about 75% to about 85%, group II is present in component C from about 3% to about 5%; and group III is present in component C from about 10% to about 22%; wherein said groups I, II and III are based on the number of acetal groups in component C.

9. The photopolymerizable composition of claim 4 which comprises one or more compounds selected from the group consisting of benzoyl peroxide, di-t-butyl diperoxyphthalate, t-butyl perbenzoate and t-butyl-1-pernaphthoate.

10. The photopolymerizable composition of claim 4 wherein the ratio of 9-phenyl acridine, or phenazine compound to peroxide or perester compound ranges from about 99:1 to about 1:99.

11. The photopolymerizable composition of claim 4 further comprising one or more components selected from the group consisting of colorants, acid stabilizers, exposure indicators, plasticizers, solvents and photoactivators.

12. The composition of claim 4 further comprising one or more solvents selected from the group consisting of water, tetrahydrofuran, butyrolactone, glycol ethers, alcohols and ketones.

13. A photographic element which comprises a substrate and a photopolymerizable composition coated on said substrate, which photopolymerizable composition comprises a photopolymerizable monomer or oligomer containing at least two ethenically unsturated double bonds and a photopolymerization initiator composition which comprises a 9-phenyl acridine, or a phenazine compound and at least one peroxide or perester compound.

14. The element of claim 13 wherein said composition further comprises one or more solvents selected from the group consisting of water, tetrahydrofuran, butyrolactone, glycol ethers, alcohols and ketones.

15. The photographic element of claim 13 wherein said substrate comprises a material selected from the group consisting of transparent films, metals, fabrics and semiconductor materials.

16. The photographic element of claim 13 wherein said substrate comprises a material selected from the group consisting of polyester, silicon, gallium arsenide, aluminum and its alloys.

17. The photographic element of claim 13 wherein said substrate comprises aluminum or an aluminum alloy sheet, the surface of which has been subjected to one or more treatments selected from the group consisting of graining, anodizing and hydrophilizing.

18. The photographic element of claim 13 wherein the photopolymerizable compound is an acrylic or methacrylic acid ester.

19. The photographic element of claim 13 wherein the photoplymerizable composition further comprising a binder in sufficient amount to bind the composition components in a uniform mixture.

20. The photographic element of claim 19 comprising a binder selected from the group consisting of polyvinyl acetals, polyvinyl pyrrolidone, cellulosic resins, styrene maleic anhydride copolymers, styrene/maleic anhydride polymers having a monomer ratio of from about 70/30 to about 95/5; polymethyl methacrylate/methacrylic acid copolymers having a monomer ratio of from about 70/30 to about 95/5; polymethyl methacrylate/ethyl acrylate/methacrylic acid copolymer having a monomer ratio of from about 50/30/20 to about 90/5/5; and polymethyl methacrylate/butyl acrylate/methacrylic acid copolymer having a monomer ratio of from about 50/30/20 to about 90/5/5.

21. The photographic element of claim 19 wherein the binding resin has the general formula

-A-B-C- wherein a plurlaity of each of components A, B and C occur in ordered or randon sequence in the resin and wherein A is present in said resin at about 5% to about 20% by weight and comprises groups of the formula

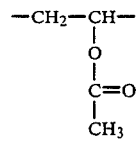

B is present in said resin at about 4% to about 30% by weight and comprises groups of the formula

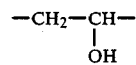

and C is present in said resin at about 50% to about 91% by weight and comprises acetal groups consisting of groups of the formulae

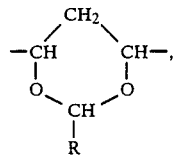 (I)

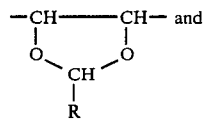 and (II)

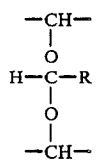 (III)

where R is lower alkyl or hydrogen, and wherein said group I is present in component C from about 75% to about 85%, group II is present in component C from about 3% to about 5%; and group III is present in component C from about 10% to about 22%; wherein said groups I, II and III are based on the number of acetal groups in components C.

22. The photographic element of claim 14 wherein the photopolymerizable composition further comprises one or more components, selected from the group consisting of colorants, acid stabilizers, exposure indicators, plasticizers, solvents and photoactivators.

23. The photographic element of claim 13 which comprises one or more compounds selected from the group consisting of benzoyl peroxide, di-t-butyl diperoxyphthalate, t-butyl perbenzoate and t-butyl-1-pernaphthoate.

24. The photographic element of claim 13 wherein the ratio of 9-phenyl acridine, or phenazine compound to peroxide or perester compound ranges from about 99:1 to about 1:99.

* * * * *